United States Patent
Zhang et al.

[11] Patent Number: 5,925,501
[45] Date of Patent: Jul. 20, 1999

[54] DARK CF$_4$ FLASH

[75] Inventors: Xin Zhang; Guat Choo Carol Goh, both of Singapore, Singapore

[73] Assignee: Chartered Semiconductor Manufacturing Ltd, Singapore, Singapore

[21] Appl. No.: 08/990,696

[22] Filed: Dec. 15, 1997

[51] Int. Cl.$^6$ .................................................. G03F 7/36
[52] U.S. Cl. ..................... 430/313; 430/315; 134/1.2; 216/13
[58] Field of Search ................... 430/313, 315; 134/1.2; 216/13

[56] References Cited

U.S. PATENT DOCUMENTS

| | | | |
|---|---|---|---|
| 5,007,981 | 4/1991 | Kawasaki et al. | 134/1.2 |
| 5,174,856 | 12/1992 | Hwang et al. | 216/69 |
| 5,200,031 | 4/1993 | Latchford et al. | 216/13 |
| 5,221,424 | 6/1993 | Rhoades | 216/13 |
| 5,382,316 | 1/1995 | Hills et al. | 216/67 |
| 5,545,289 | 8/1996 | Chen et al. | 134/1.2 |
| 5,798,303 | 8/1998 | Clampitt | 134/1.2 |

*Primary Examiner*—Hoa Van Le
*Attorney, Agent, or Firm*—George O. Saile; Rosemary L. S. Pike

[57] ABSTRACT

A new method of removing photoresist residues and sidewall deposits is described. Semiconductor device structures are provided in and on a semiconductor substrate. The semiconductor device structures are covered with an insulating layer. A metal layer is deposited overlying the insulating layer. The metal layer is covered with a layer of photoresist. The photoresist layer is exposed to actinic light and developed and patterned to form the desired photoresist mask. The metal layer is etched away where it is not covered by the photoresist mask to form metal lines whereby a photoresist residue remains overlying the metal lines and whereby sidewall deposits form on the sidewalls of the metal lines. The wafer is exposed to a plasma comprising O$_2$ and CF$_4$ at a low power of less than about 200 watts whereby an upper portion of the photoresist residue and a portion of the sidewall deposits are removed. Thereafter, the wafer is heated and then rinsed whereby all of the sidewall deposits are removed. Thereafter, the wafer is exposed to oxygen ashing whereby all of the photoresist residue is removed.

27 Claims, 2 Drawing Sheets

DARK CF$_4$ FLASH

BACKGROUND OF THE INVENTION

(1) Field of the Invention

The invention relates to a method of photoresist stripping, and more particularly, to a method of photoresist stripping which also removes polymer buildup and prevents corrosion in the manufacture of integrated circuits.

(2) Description of the Prior Art

In the manufacture of integrated circuit devices, photoresist is often used as a mask when etching metal to form metal lines. After metal etching, photoresist residue remains on the metal lines. A Cl$_2$ and BCl$_3$ plasma is often used in etching the metal lines. Chlorine-containing etchant byproducts form on the sidewalls of the metal lines during etching. If these byproducts are left on the sidewalls of the metal lines, they will react with absorbed moisture from the atmosphere to form hydrochloric acid which will corrode the metal lines. The so-called mouse-bite is a kind of pitting corrosion of the metal sidewalls which is triggered by the post-metal etch treatment and magnified during the subsequent solvent clean process.

It is desired to remove the photoresist residue and the polymer buildup on the sidewalls of the metal lines. In current practice, one solution is to preheat the wafer, then rinse it with water and use oxygen ashing to partially strip the photoresist and to remove the polymer. This prevents the corrosion and mouse-bite problems because it forms a homogeneous and thick native oxide layer at the metal sidewalls, but leaves some of the photoresist residue for a downstream process to remove. Even this partial strip can take a long time, as much as 100 seconds.

Many workers in the art have addressed this problem. Conventional stripping methods use a plasma of oxygen and an oxygen-activating gas such as CF$_4$. This is sometimes ineffective when a polymeric resist is hardened by exposure to a plasma. Passivation techniques are used to prevent corrosion. The chlorine-etchant byproducts on the sidewalls of the metal lines are exposed to a CF$_4$ plasma, for example. The CF$_4$ plasma coats the sidewall polymer, preventing it from reacting to the atmospheric moisture. A wet chemical etchant is often used to strip sidewall deposits. A number of patents use O$_2$ and CF$_4$ to remove photoresist and sidewall residues. For example, U.S. Pat. No. 5,545,289 to Chen et al, U.S. Pat. No. 5,382,316 to Hills et al, U.S. Pat. No. 5,174,856 to Hwang et al, U.S. Pat. No. 5,221,424 to Rhoades, and U.S. Pat. No. 5,007,981 to Kawasaki et al all use these two gases. Hwang et al also uses O$_2$ and NH$_3$ in a second step. All of these methods use a high power of more than 500 watts. U.S. Pat. No. 5,200,031 to Latchford et al uses NH$_3$ and O$_2$ alone to remove photoresist and sidewall residues.

SUMMARY OF THE INVENTION

Accordingly, it is a principal object of the present invention to provide an effective and very manufacturable method of removing photoresist residues and sidewall deposits in the manufacture of integrated circuits.

Another object of the present invention is to provide a method of removing photoresist residues and sidewall deposits and to prevent metal corrosion.

Yet another object of the present invention is to provide a method of removing photoresist residues and sidewall deposits and to prevent metal sidewall voiding.

A further object of the invention is to provide a method of removing photoresist residues and sidewall deposits with improved throughput.

In accordance with the objects of this invention a new method of removing photoresist residues and sidewall deposits is achieved. Semiconductor device structures are provided in and on a semiconductor substrate. The semiconductor device structures are covered with an insulating layer. A metal layer is deposited overlying the insulating layer. The metal layer is covered with a layer of photoresist. The photoresist layer is exposed to actinic light and developed and patterned to form the desired photoresist mask. The metal layer is etched away where it is not covered by the photoresist mask to form metal lines whereby a photoresist residue remains overlying the metal lines and whereby sidewall deposits form on the sidewalls of the metal lines. The wafer is exposed to a plasma comprising O$_2$ and CF$_4$ at a low power of less than about 200 watts whereby an upper portion of the photoresist residue and a portion of the sidewall deposits are removed. Thereafter, the wafer is heated and then rinsed whereby all of the sidewall deposits are removed. Thereafter, the wafer is exposed to oxygen ashing whereby all of the photoresist residue is removed.

BRIEF DESCRIPTION OF THE DRAWINGS

In the accompanying drawings forming a material part of this description, there is shown.

DESCRIPTION OF THE PREFERRED EMBODIMENTS

Figure 1:
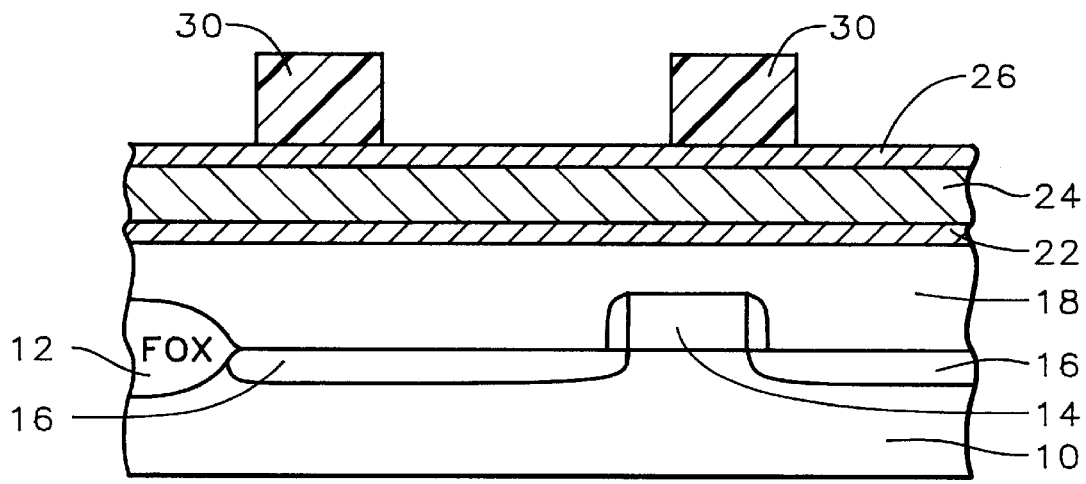
FIGS. 1 through 5 schematically illustrate in cross-sectional representation a preferred embodiment of the present invention.

Referring now more particularly to FIG. 1, there is illustrated a portion of a partially completed integrated circuit. Semiconductor substrate 10 is preferably composed of monocrystalline silicon. Field oxide regions 12 have been formed as is conventional in the art in the semiconductor substrate 10. Semiconductor device structures, such as gate electrode 14 and source and drain regions 16, are fabricated in and on the semiconductor substrate. A thick insulating layer of silicon dioxide or borophosphosilicate glass (BPSG), or the like, 18 is blanket deposited over the semiconductor device structures.

Next, a barrier layer 22 is deposited over the insulating layer. This may be titanium nitride or titanium tungsten, or the like. The metal layer 24 is deposited over the barrier layer 22. The metal layer comprises aluminum or an aluminum alloy such as AlSiCu. An antireflective coating (ARC) 26, such as titanium nitride, is deposited over the aluminum layer. A coating of photoresist covers the ARC layer. The photoresist is exposed and developed to form the photoresist mask 30.

Figure 2:
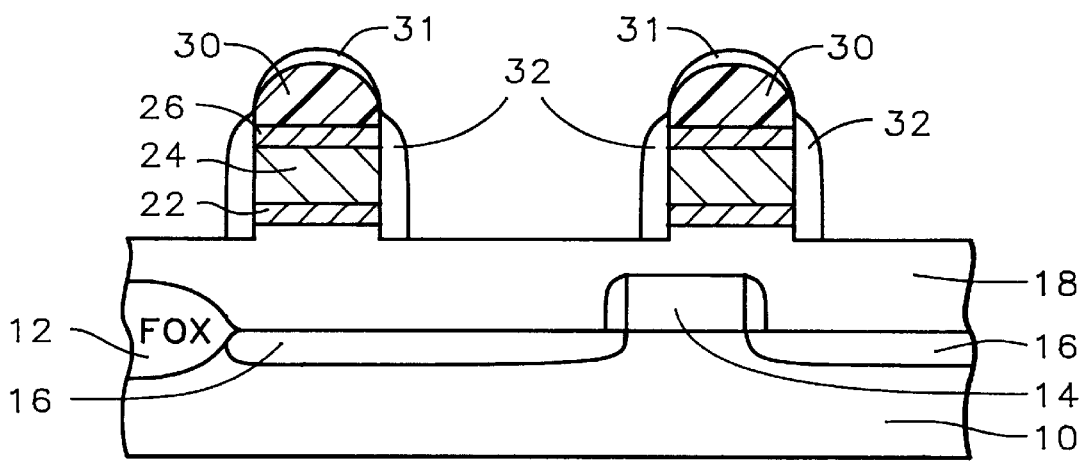

Now, the metal layer stack is etched away where it is not covered by the mask, as illustrated in FIG. 2. Photoresist residue 30 and 31 remains on top of the metal lines. Sidewall polymer 32 has been formed on the metal lines. Typically, Cl$_2$ and BCl$_3$ gases are used to etch the metal lines. The sidewall polymer contains Cl byproducts which, if left on the sidewalls, will absorb atmospheric moisture and cause corrosion of the metal lines.

Typically, the wafer would be preheated to about 250° C. to form a native oxide on the metal layer in order to prevent mouse-bite, or metal sidewall voiding. However, this heating will have the side effect of further hardening of the outer "skin" of the photoresist, making it much more difficult to remove. The "skin" of the photoresist 31 is hardened initially by exposure to the plasma etchants during etching of the metal lines.

After preheating, the wafer would be rinsed in $H_2O$ and $O_2$ plasma and then subjected to oxygen ashing. Because of the hardening of the skin of the photoresist, the oxygen ashing would not completely remove the photoresist residue.

In general, conventional resist stripping is performed in a downstream etcher in order to strip off the photoresist residue and passivate the metal sidewall completely. This is designed to be a high power process.

The novel Dark $CF_4$ Plasma Flash technique of the present invention will now be described in detail. In order to prevent mouse-bite and corrosion and to remove all of the photoresist residue with high throughput, an additional step was added before the preheating step. $O_2$ plasma alone could not be used at the step because of the corrosion problem. $O_2$ and $H_2O$ plasma could not be used because of the mouse-bite problem. The key step of the present invention is to use a dark plasma; that is, very low radio frequency (RF) power. An $O_2$ and $CF_4$ plasma is used at this step. The $O_2/CF_4$ ratio is optimized to achieve low oxide loss without corrosion. The low RF power permits the hardened skin of the photoresist to be removed before the wafer is heated.

Specifically, the RF power must be less than about 200 watts, preferably between 160 and 200 watts. $O_2$ is flowed at between about 200 to 300 sccm and $CF_4$ is flowed at between about 60 and 90 sccm. This step has a duration of less than about 10 seconds. A power higher than 200 watts cannot be used because the higher power will cause too much of the sidewall polymer to be removed, thereby exposing the aluminum to the atmosphere before the $O_2/H_2O$ passivation step. This will cause corrosion of the metal to occur.

Figure 3:
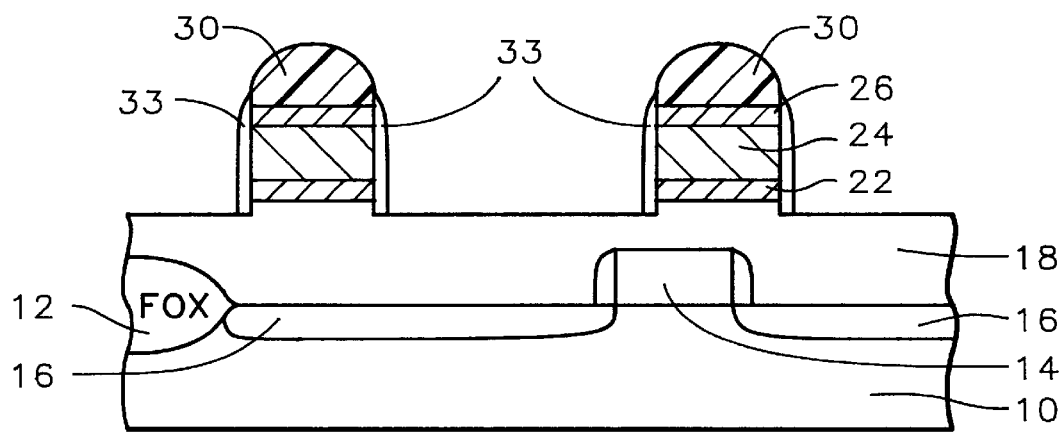

After the new dark $CF_4$ flash step, the outer skin of the photoresist residue 31 is removed, as illustrated in FIG. 3, leaving smaller residue 30. Because of the protection of the photoresist residue 30, the underlying ARC coating 26 is not attacked by the $O_2/CF_4$ plasma. The chlorine-containing etchant byproducts on the sidewalls of the metal lines are also removed, leaving other sidewall deposits 33 which will protect the barrier metal 22.

Figure 4:
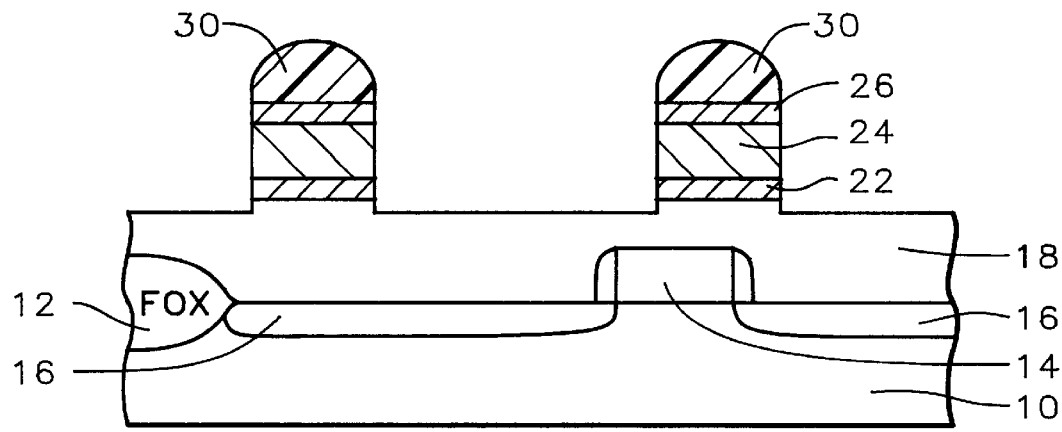
Figure 5:
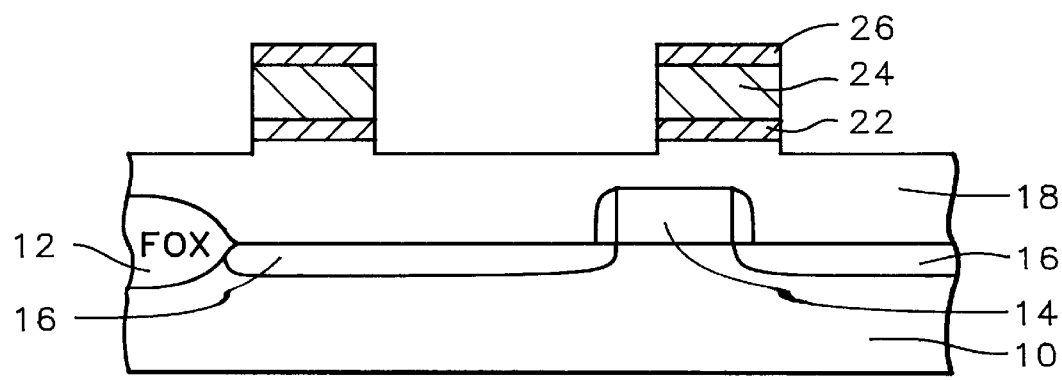

The wafer is now preheated, as is conventional, to about 250° C. This preheating will harden the remaining photoresist 30 to a certain extent, but since the photoresist skin 31 hardened during etching has already been removed, the remaining photoresist can be removed easily by the subsequent ashing step. The wafer is rinsed to remove the remaining sidewall deposits 33, as illustrated in FIG. 4. Finally, $O_2$ ashing is performed to remove the remaining photoresist residue 30, as illustrated in FIG. 5. This oxygen ashing step takes only about 40 seconds, rather than the 100 seconds required in the prior art.

The process of the present invention provides a very effective and time-saving method of removing photoresist residue with no mouse-bite issue, good anti-corrosion performance, and protection of the underlying ARC layer. The Dark $CF_4$ Flash process of the invention uses a very low RF power of less than 200 watts and takes fewer than 10 seconds. The subsequent oxygen ashing step takes about 40 seconds compared to the prior art ashing step which takes 100 seconds.

While the invention has been particularly shown and described with reference to the preferred embodiments thereof, it will be understood by those skilled in the art that various changes in form and details may be made without departing from the spirit and scope of the invention.

What is claimed is:

1. A method of removing photoresist residue and sidewall deposits from a wafer in the fabrication of an integrated circuit comprising:

providing semiconductor device structures in and on a semiconductor substrate;

covering said semiconductor device structures with an insulating layer;

depositing a metal layer overlying said insulating layer;

covering said metal layer with a layer of photoresist;

exposing said photoresist layer to actinic light and developing and patterning said photoresist layer to form the desired photoresist mask;

etching away said metal layer where it is not covered by said photoresist mask to form metal lines whereby said photoresist residue remains overlying said metal lines and whereby said sidewall deposits form on the sidewalls of said metal lines;

exposing said wafer to a plasma comprising $O_2$ and $CF_4$ at a low power of less than about 200 watts whereby an upper portion of said photoresist residue and a portion of said sidewall deposits are removed;

thereafter heating said wafer;

thereafter rinsing said wafer whereby all of said sidewall deposits are removed; and thereafter exposing said wafer to oxygen ashing whereby all of said photoresist residue is removed completing said removing said photoresist residue and said sidewall deposits from said wafer in said fabrication of said integrated circuit.

2. The method according to claim 1 wherein said semiconductor device structures include gate electrodes and source and drain regions.

3. The method according to claim 1 further comprising depositing a barrier metal layer underlying said metal layer.

4. The method according to claim 1 wherein said metal layer comprises aluminum.

5. The method according to claim 1 wherein said metal layer comprises an aluminum alloy.

6. The method according to claim 1 further comprising depositing an antireflective coating layer overlying said metal layer.

7. The method according to claim 1 wherein said sidewall deposits include chlorine-containing etchant byproducts.

8. The method according to claim 1 wherein said step of exposing said wafer to a plasma comprising $O_2$ and $CF_4$ comprises flowing $O_2$ at a rate of between about 200 and 300 sccm and flowing $CF_4$ at a rate of between about 60 and 90 sccm for less than about 10 seconds.

9. The method according to claim 1 wherein said upper portion of said photoresist residue removed by exposing said wafer to a plasma comprising $O_2$ and $CF_4$ at said low power is a hardened outside layer of said photoresist residue.

10. The method according to claim 7 wherein said portion of said sidewall deposits removed by exposing said wafer to a plasma comprising $O_2$ and $CF_4$ are those deposits having chlorine-containing etchant byproducts.

11. A method of removing photoresist residue and sidewall deposits from a wafer in the fabrication of an integrated circuit comprising:

providing semiconductor device structures in and on a semiconductor substrate;

covering said semiconductor device structures with an insulating layer;

depositing a barrier metal layer overlying said insulating layer;

depositing a metal layer overlying said barrier metal layer;

depositing an antireflective coating layer overlying said metal layer;

covering said antireflective coating layer with a layer of photoresist;

exposing said photoresist layer to actinic light and developing and patterning said photoresist layer to form the desired photoresist mask;

etching away said metal layer where it is not covered by said photoresist mask to form metal lines whereby said photoresist residue remains overlying said metal lines and whereby said sidewall deposits form on the sidewalls of said metal lines;

exposing said wafer to a plasma comprising $O_2$ and $CF_4$ at a low power of less than about 200 watts whereby an upper portion of said photoresist residue and a portion of said sidewall deposits are removed;

thereafter heating said wafer;

thereafter rinsing said wafer whereby all of said sidewall deposits are removed; and thereafter exposing said wafer to oxygen ashing whereby all of said photoresist residue is removed completing said removing said photoresist residue and said sidewall deposits from said wafer in said fabrication of said integrated circuit.

12. The method according to claim 11 wherein said semiconductor device structures include gate electrodes and source and drain regions.

13. The method according to claim 11 wherein said metal layer comprises aluminum.

14. The method according to claim 11 wherein said metal layer comprises an aluminum alloy.

15. The method according to claim 11 wherein said sidewall deposits include chlorine-containing etchant byproducts.

16. The method according to claim 11 wherein said step of exposing said wafer to a plasma comprising $O_2$ and $CF_4$ comprises flowing $O_2$ at a rate of between about 200 and 300 sccm and flowing $CF_4$ at a rate of between about 60 and 90 sccm for less than about 10 seconds.

17. The method according to claim 11 wherein said upper portion of said photoresist residue removed by exposing said wafer to a plasma comprising $O_2$ and $CF_4$ at said low power is a hardened outside layer of said photoresist residue.

18. The method according to claim 11 wherein said portion of said sidewall deposits removed by exposing said wafer to a plasma comprising $O_2$ and $CF_4$ are those deposits having chlorine-containing etchant byproducts.

19. The method according to claim 11 wherein said photoresist residue remaining during said step of exposing said wafer to said plasma protects said underlying antireflective coating layer from being etched.

20. A method of removing photoresist residue and sidewall deposits from a wafer in the fabrication of an integrated circuit comprising:

providing semiconductor device structures in and on a semiconductor substrate;

covering said semiconductor device structures with an insulating layer;

depositing a barrier metal layer overlying said insulating layer;

depositing a metal layer overlying said barrier metal layer;

depositing an antireflective coating layer overlying said metal layer;

covering said antireflective coating layer with a layer of photoresist;

exposing said photoresist layer to actinic light and developing and patterning said photoresist layer to form the desired photoresist mask;

etching away said metal layer where it is not covered by said photoresist mask to form metal lines whereby said photoresist residue remains overlying said metal lines and whereby said sidewall deposits form on the sidewalls of said metal lines;

exposing said wafer to a plasma comprising $O_2$ and $CF_4$ at a low power of less than about 200 watts for less than 10 seconds whereby an upper portion of said photoresist residue and a portion of said sidewall deposits are removed;

thereafter heating said wafer;

thereafter rinsing said wafer whereby all of said sidewall deposits are removed; and thereafter exposing said wafer to oxygen ashing for no more than 40 seconds whereby all of said photoresist residue is removed completing said removing said photoresist residue and said sidewall deposits from said wafer in said fabrication of said integrated circuit.

21. The method according to claim 20 wherein said metal layer comprises aluminum.

22. The method according to claim 20 wherein said metal layer comprises an aluminum alloy.

23. The method according to claim 20 wherein said sidewall deposits include chlorine-containing etchant byproducts.

24. The method according to claim 20 wherein said step of exposing said wafer to a plasma comprising $O_2$ and $CF_4$ comprises flowing $O_2$ at a rate of between about 200 and 300 sccm and flowing $CF_4$ at a rate of between about 60 and 90 sccm.

25. The method according to claim 20 wherein said upper portion of said photoresist residue removed by exposing said wafer to a plasma comprising $O_2$ and $CF_4$ at said low power is a hardened outside layer of said photoresist residue.

26. The method according to claim 20 wherein said portion of said sidewall deposits removed by exposing said wafer to a plasma comprising $O_2$ and $CF_4$ are those deposits having chlorine-containing etchant byproducts.

27. The method according to claim 20 wherein said photoresist residue remaining during said step of exposing said wafer to said plasma protects said underlying antireflective coating layer from being etched.

* * * * *